United States Patent
Cook et al.

(10) Patent No.: US 9,941,194 B1
(45) Date of Patent: Apr. 10, 2018

(54) PACKAGED SEMICONDUCTOR DEVICE HAVING PATTERNED CONDUCTANCE DUAL-MATERIAL NANOPARTICLE ADHESION LAYER

(71) Applicant: TEXAS INSTRUMENTS INCORPORATED, Dallas, TX (US)

(72) Inventors: Benjamin Stassen Cook, Addison, TX (US); Daniel Yong Lin, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/437,580

(22) Filed: Feb. 21, 2017

(51) Int. Cl.
| | | |
|---|---|---|
| H01L 21/00 | (2006.01) |
| H01L 23/495 | (2006.01) |
| H01L 23/00 | (2006.01) |
| H01L 21/67 | (2006.01) |
| H01L 21/48 | (2006.01) |
| H01L 21/56 | (2006.01) |
| H01L 23/29 | (2006.01) |

(52) U.S. Cl.
CPC .... *H01L 23/49586* (2013.01); *H01L 21/4825* (2013.01); *H01L 21/4857* (2013.01); *H01L 21/4867* (2013.01); *H01L 21/56* (2013.01); *H01L 21/6715* (2013.01); *H01L 21/67121* (2013.01); *H01L 23/293* (2013.01); *H01L 23/49517* (2013.01); *H01L 23/49558* (2013.01); *H01L 23/49582* (2013.01); *H01L 24/48* (2013.01); *H01L 2224/48091* (2013.01); *H01L 2224/48245* (2013.01); *H01L 2224/48465* (2013.01); *H01L 2924/183* (2013.01); *H01L 2924/186* (2013.01)

(58) Field of Classification Search
CPC ......... H01L 23/49558; H01L 23/49582; H01L 23/49586; H01L 23/28; H01L 23/293; H01L 23/49517; H01L 21/4867; H01L 21/56; H01L 21/6715
See application file for complete search history.

(56) References Cited

U.S. PATENT DOCUMENTS

| | | |
|---|---|---|
| 4,637,990 A | 1/1987 | Torobin |
| 5,073,459 A | 12/1991 | Smarsly et al. |
| 5,682,075 A | 10/1997 | Bolleman et al. |
| 6,107,216 A | 8/2000 | Kennedy et al. |
| 6,330,916 B1 | 12/2001 | Rickards et al. |

(Continued)

*Primary Examiner* — Reema Patel
*Assistant Examiner* — Syed Gheyas
(74) *Attorney, Agent, or Firm* — Michael A. Davis, Jr.; Charles A. Brill; Frank D. Cimino

(57) ABSTRACT

In an embodiment, a substrate made of a first material and having a surface is provided. A first and second nozzle dispense a first solvent paste including electrically conductive nanoparticles and a second solvent paste including non-conductive nanoparticles respectively while moving over the surface of the substrate. The first and second nozzles additively deposit a uniform layer comprising sequential and contiguous zones alternating between the first solvent paste and the second solvent paste. Energy is applied to the nanoparticles to sinter together the nanoparticles and diffuse the nanoparticles into the substrate. The sintered nanoparticles form a layer composed of an alternating sequence of electrically conductive zones contiguous with electrically non-conductive zones.

14 Claims, 4 Drawing Sheets

(56) References Cited

U.S. PATENT DOCUMENTS

| | | |
|---|---|---|
| 7,589,439 B2 | 9/2009 | Raisanen |
| 8,178,976 B2 | 5/2012 | Dunne et al. |
| 8,647,979 B2 * | 2/2014 | Yaniv .................... B22F 3/105 |
| | | 257/774 |
| 8,728,991 B2 | 5/2014 | Wu et al. |
| 8,815,648 B1 | 8/2014 | Aoya et al. |
| 9,236,169 B2 | 1/2016 | Hong et al. |
| 2004/0137209 A1 | 7/2004 | Zeller et al. |
| 2004/0214452 A1 * | 10/2004 | Freeman .......... H01C 17/06586 |
| | | 438/795 |
| 2005/0048758 A1 | 3/2005 | Hosseini et al. |
| 2006/0211802 A1 | 9/2006 | Asgari |
| 2006/0266714 A1 | 11/2006 | Olson, III et al. |
| 2007/0114138 A1 | 5/2007 | Krasteva et al. |
| 2007/0201122 A1 * | 8/2007 | Dozeman ................ B60R 1/088 |
| | | 359/265 |
| 2008/0105853 A1 | 5/2008 | Ueda et al. |
| 2008/0145607 A1 | 6/2008 | Kajiwara et al. |
| 2008/0272344 A1 | 11/2008 | Jiang et al. |
| 2008/0286488 A1 | 11/2008 | Li et al. |
| 2009/0020865 A1 | 1/2009 | Su |
| 2009/0045907 A1 | 2/2009 | Hoidis et al. |
| 2009/0096100 A1 | 4/2009 | Kajiwara et al. |
| 2009/0189264 A1 | 7/2009 | Yato et al. |
| 2009/0211638 A1 | 8/2009 | Park et al. |
| 2009/0274833 A1 | 11/2009 | Li et al. |
| 2010/0055302 A1 | 3/2010 | Kim et al. |
| 2010/0155496 A1 * | 6/2010 | Stark .................... B05B 5/0255 |
| | | 239/3 |
| 2010/0171064 A1 | 7/2010 | Shim et al. |
| 2010/0187678 A1 | 7/2010 | Kajiwara et al. |
| 2010/0196681 A1 | 8/2010 | Song et al. |
| 2011/0124252 A1 | 5/2011 | Shimomura et al. |
| 2011/0160104 A1 | 6/2011 | Wu et al. |
| 2011/0300305 A1 | 12/2011 | Li et al. |
| 2012/0015147 A1 | 1/2012 | Maa et al. |
| 2012/0089180 A1 * | 4/2012 | Fathi .................... B41J 2/17559 |
| | | 606/214 |
| 2012/0115271 A1 | 5/2012 | Holliman et al. |
| 2012/0119342 A1 * | 5/2012 | Chang Chien ...... H01L 21/4832 |
| | | 257/676 |
| 2012/0144958 A1 | 6/2012 | Olson, III et al. |
| 2012/0153216 A1 | 6/2012 | Wrosch |
| 2012/0175147 A1 | 7/2012 | Nakako et al. |
| 2012/0186644 A1 | 7/2012 | Ko et al. |
| 2012/0251736 A1 | 10/2012 | Hong et al. |
| 2014/0048749 A1 | 2/2014 | Lockett et al. |
| 2014/0166098 A1 | 6/2014 | Kian et al. |
| 2014/0249058 A1 | 9/2014 | Wu et al. |
| 2014/0284779 A1 | 9/2014 | Hayata et al. |
| 2015/0069611 A1 | 3/2015 | Martin et al. |
| 2015/0070752 A1 | 3/2015 | Sadlik et al. |
| 2015/0173200 A1 | 6/2015 | Kim et al. |
| 2015/0179478 A1 | 6/2015 | Xiu et al. |
| 2015/0214095 A1 * | 7/2015 | Mischitz ........... H01L 21/76885 |
| | | 438/660 |
| 2015/0217411 A1 | 8/2015 | Ishikawa et al. |
| 2016/0005671 A1 | 1/2016 | Tsuyuno et al. |
| 2016/0211083 A1 | 7/2016 | Kanatzidis et al. |
| 2016/0286654 A1 | 9/2016 | Romig et al. |
| 2016/0372693 A1 | 12/2016 | Kumaki et al. |
| 2016/0381844 A1 * | 12/2016 | Knox .................... H05K 3/1241 |
| | | 29/739 |
| 2017/0004978 A1 * | 1/2017 | Hwang .................. C09D 11/52 |
| 2017/0181291 A1 | 6/2017 | Bell et al. |
| 2017/0213615 A1 | 6/2017 | Okada et al. |
| 2017/0294397 A1 | 10/2017 | Croteau et al. |
| 2017/0309549 A1 | 10/2017 | Wachtler et al. |

* cited by examiner

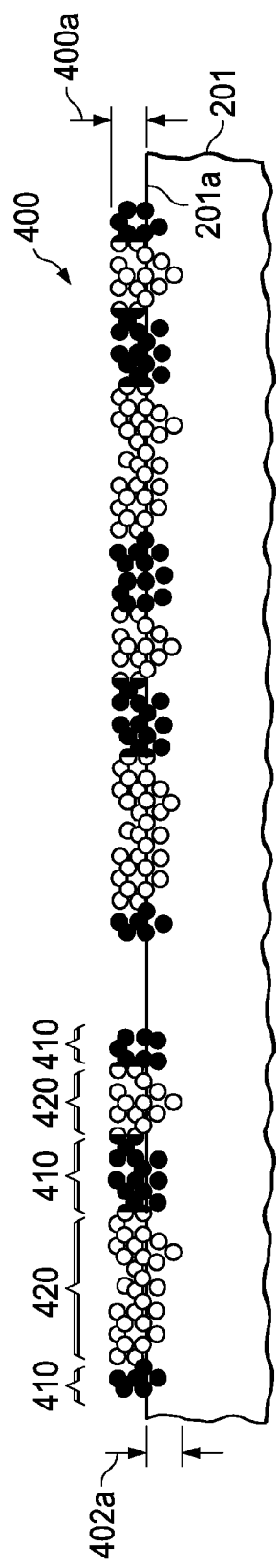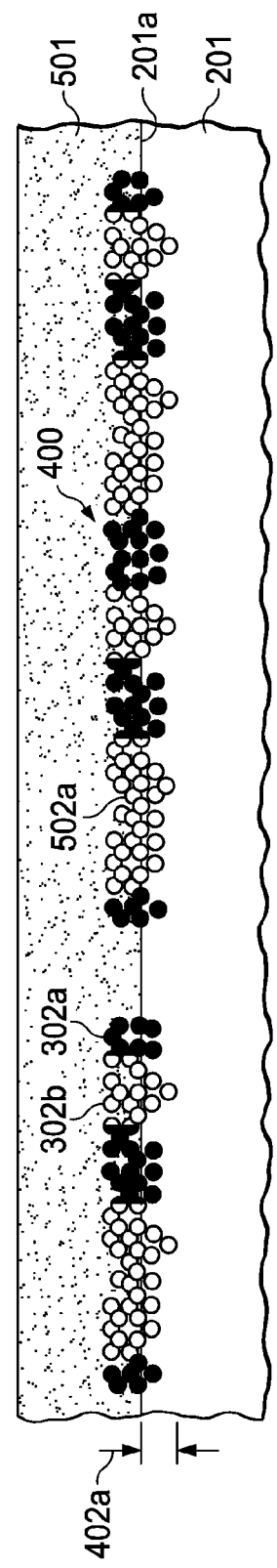

PACKAGED SEMICONDUCTOR DEVICE HAVING PATTERNED CONDUCTANCE DUAL-MATERIAL NANOPARTICLE ADHESION LAYER

FIELD

Embodiments of the present invention are related in general to the field of semiconductor devices and processes, and more specifically to the structure and fabrication of packaged semiconductor devices having patterned conductance dual-material nanoparticle layers.

DESCRIPTION OF RELATED ART

Based on their functions, semiconductor packages include a variety of different materials. Metals formed as leadframes are employed for mechanical stability, and electrical and thermal conductance. Insulators, such as polymeric molding compounds, are used for encapsulations. In packaging fabrication, it is common practice to attach a plurality of semiconductor chips to a strip of leadframe (or packaging substrate), to connect the chips to their respective leads, and then to encapsulate the assembled chips in packages. Packages protect the enclosed parts against mechanical damage and environmental influences such as moisture and light. After the encapsulation step, the package chips are separated from the leadframe strip (or packaging substrate) into discrete units by a trimming and forming step.

Today's semiconductor technology employs a number of methods to raise the level of adhesion between the diversified materials so that the package passes accelerated tests and use conditions without delamination. Among the efforts are chemically purifying the molding compounds, activating leadframe metal surfaces for instance by plasma just prior to the molding process, and enhancing the affinity of leadframe metals to polymeric compounds by oxidizing the base metal. Furthermore, design features such as indentations, grooves or protrusions, overhangs and other three-dimensional features are added to the leadframe surface for improved interlocking with the package material.

Another example of known technology to increase adhesion between leadframe, chip, and encapsulation compound in semiconductor packages, is the roughening of the whole leadframe surface by chemically etching the leadframe surface after stamping or etching the pattern from a metal sheet. Chemical etching is a subtractive process using an etchant. Chemical etching creates a micro-crystalline metal surface.

Yet another known method to achieve a rough surface is the use of a specialized metal plating bath, such as a nickel plating bath, to deposit a rough metal (such as nickel) layer. This method is an additive process; the created surface roughness is on the order of 1 to 10 µm. Roughening of the leadframe surface may have some unwelcome side effects. General roughening of the surface impacts wire bonding negatively. For example, vision systems have trouble seeing the roughened surface, the rough surface shortens capillary life; and micro-contaminants on the rough surface degrade bonding consistency. General rough surfaces tend to allow more bleeding, when the resin component separates from the bulk of the chip attach compound and spreads over the surface of the chip pad. The resin bleed, in turn, can degrade moisture level sensitivity and interfere with down bonds on the chip pad.

The success of all these efforts has only been limited, especially because the adhesive effectiveness is diminishing ever more when another downscaling step of device miniaturization is implemented.

SUMMARY

In an embodiment, a substrate made of a first material and having a surface is provided. A first and second nozzle dispense a first solvent paste including electrically conductive nanoparticles and a second solvent paste including non-conductive nanoparticles respectively while moving over the surface of the substrate. The first and second nozzles additively deposit a uniform layer comprising sequential and contiguous zones alternating between the first solvent paste and the second solvent paste. Energy is applied to the nanoparticles to sinter together the nanoparticles and diffuse the nanoparticles into the substrate. The sintered nanoparticles form a layer composed of an alternating sequence of electrically conductive zones contiguous with electrically non-conductive zones.

BRIEF DESCRIPTION OF THE DRAWINGS

FIG. 4 depicts the dual-material nanoparticle adhesion layer after sintering and after the concurrent diffusion of molecules of the dual-material into substrate according to an embodiment of the invention.

FIG. 5 shows the encapsulation of the dual-material nanoparticle adhesion layer by a packaging compound according to an embodiment of the invention.

DETAILED DESCRIPTION OF THE PREFERRED EMBODIMENTS

Figure 1:
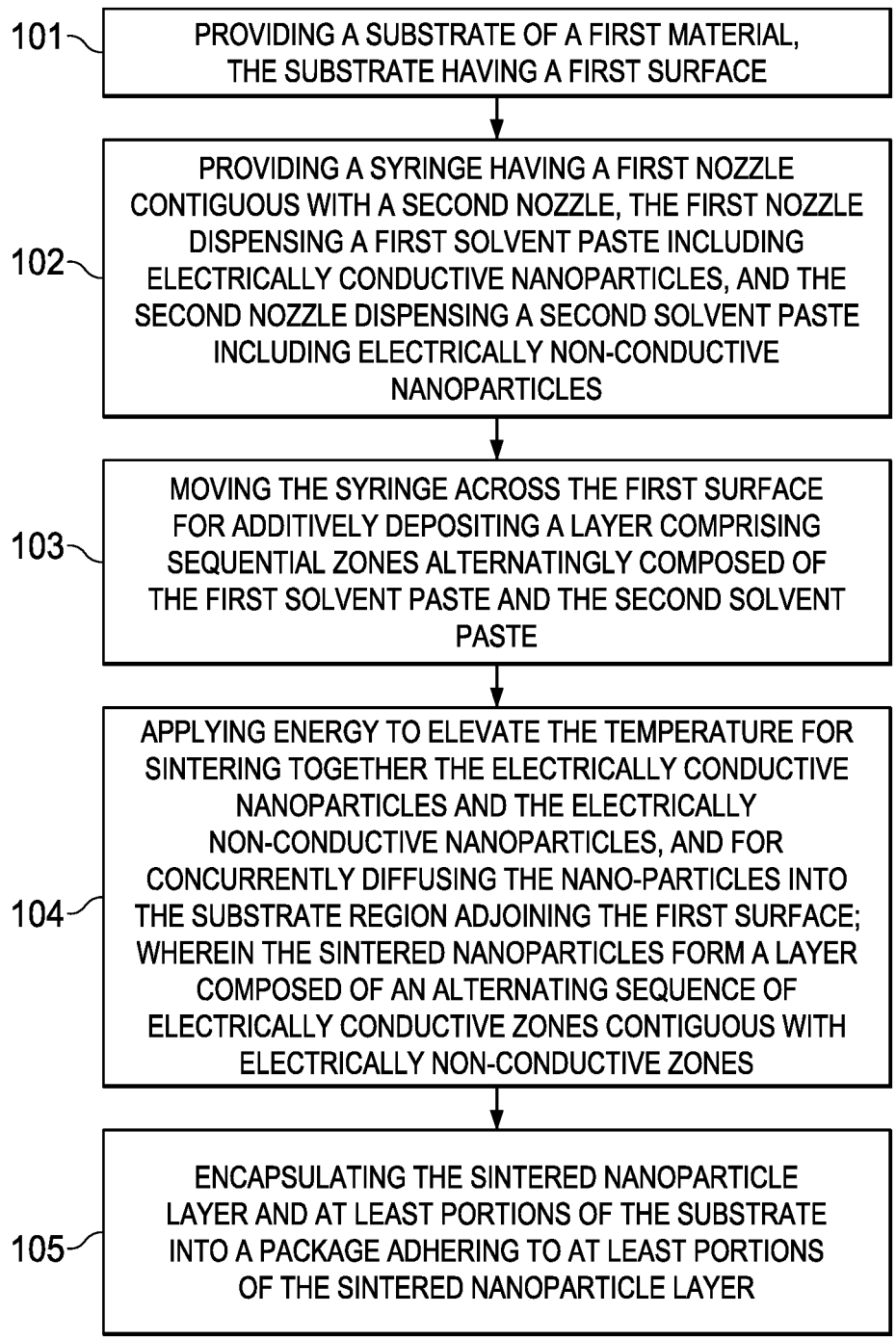
FIG. 1 is a flow diagram summarizing the process of creating a dual-material nanoparticle adhesion layer having zones with alternating electrical conductance and non-conductance according to an embodiment of the invention.

In an embodiment of the invention, a method for enhancing the adhesion and mechanical bonding between objects made of diverse materials such as metals and polymerics is described. The method comprises the formation and anchoring of an additive adhesion film composed of intermeshed nanoparticle layers between the objects. FIG. 1 is a diagram summarizing an embodiment of the invention. An object, onto which the additive film is constructed, is herein referred to as substrate, while another object, which needs adhesion to the substrate, is herein referred to as package. As examples, a substrate is denoted 201 in FIG. 2, and a package is denoted 501 in FIG. 5.

An application of the process flow shown in FIG. 1 can be applied to the fabrication technology of semiconductor devices. In semiconductor technology, the substrate typically is either a metallic leadframe or a laminated substrate composed of a plurality of alternating electrically insulating and electrically conductive layers. In step 101 of FIG. 1, a substrate is selected, which is made of a first material and has a surface extending in two dimensions; herein, the surface is referred to as first surface.

When the substrate is a leadframe (for example see FIG. 6), such leadframe may be etched or stamped from a thin sheet of base metal such as copper, copper alloy, iron-nickel alloy, aluminum, Kovar™, and others, in a typical thickness range from 120 to 250 µm. As used herein, the term base metal has the connotation of starting material and does not imply a chemical characteristic. Some leadframes may have additional metal layers plated onto the complete or the partial surface areas of the base metal; examples are plated nickel, palladium, and gold layers on copper leadframes.

A leadframe provides a stable support pad (601 in FIG. 6) for positioning the semiconductor chip (610). Further, a leadframe provides conductive leads (603) to bring various electrical conductors into close proximity of the chip. Any remaining gap between the tip of the leads and the chip terminals is typically bridged by thin bonding wires (630). Alternatively, in flip-chip technology the chip terminals may be connected to the leads by metal bumps. For the leadframe, the desired shape of pad, leads, and other geometrical features are etched or stamped from the original metal sheet.

Besides chemical affinity between a molding compound and the metal finish of the leadframe, reliable adhesion may necessitate leadframe surface roughness. In addition, the requirement to use lead-free solders pushes the reflow temperature range into the neighborhood of about 260° C., making it more difficult to maintain mold compound adhesion to the leadframes at elevated temperatures.

Figures 2, 3:
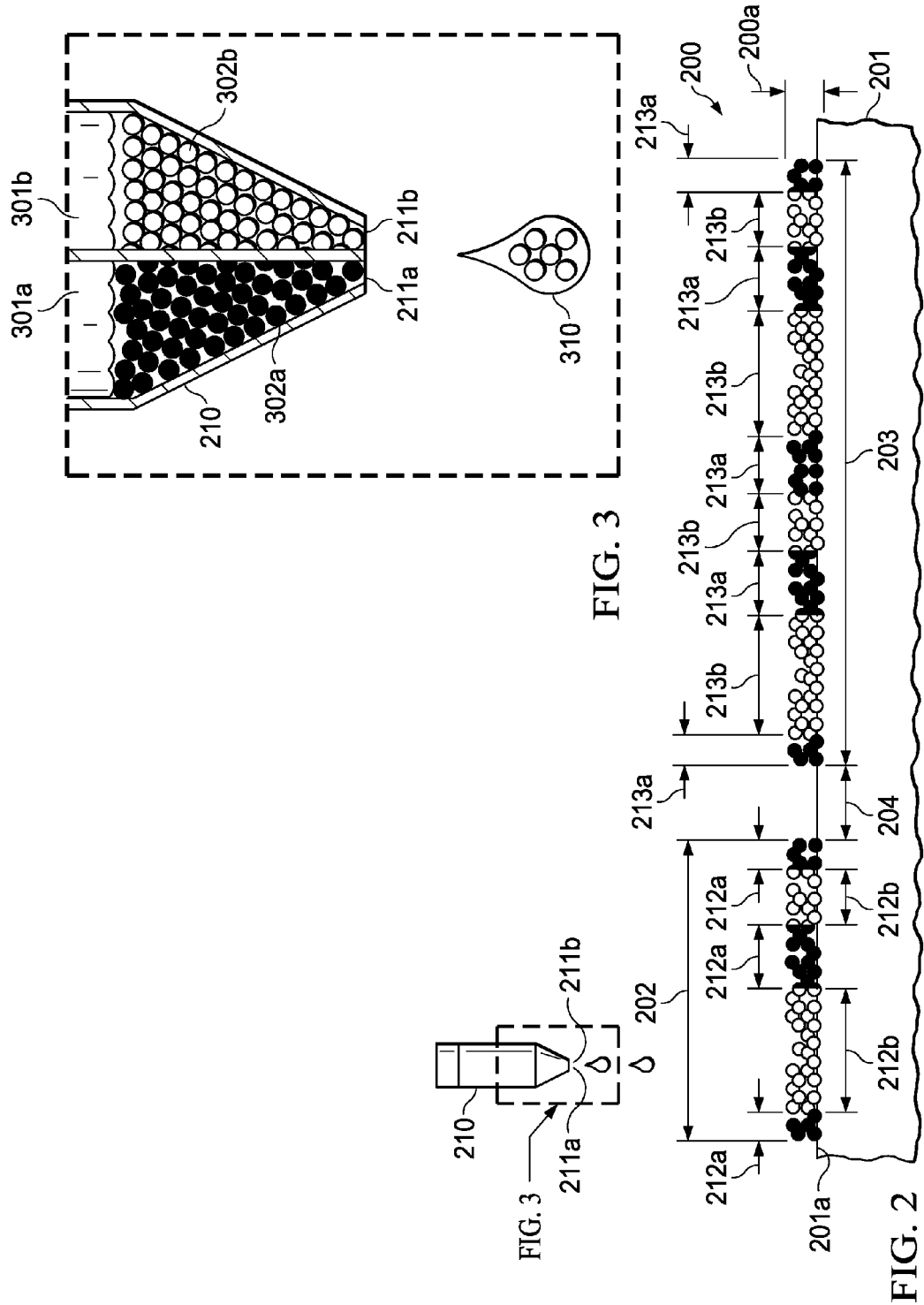
FIG. 2 illustrates the formation a dual-material nanoparticle adhesion layer with patterned electrical conductance and non-conductance according to an embodiment of the invention.
FIG. 3 illustrates a syringe of an inkjet printer, wherein the syringe has a first nozzle for dispensing a first solvent paste including electrically conductive nanoparticles and a second nozzle for dispensing a second solvent paste including electrically non-conductive nanoparticles according to an embodiment of the invention.

Referring to the process flow of FIG. 1, during step 102 of the process flow, equipment for depositing solvent pastes is provided. Preferably, the equipment includes a computer-controlled inkjet printer with a moving syringe 210 with nozzle 211. An example is illustrated in FIG. 2. From the nozzle, discrete drops 310 of the paste are released. Automated inkjet printers can be selected from a number of commercially available printers. Alternatively, a customized inkjet printer can be designed to work for specific pastes. Alternatively, any additive method can be used including inkjet printing, screen printing, gravure printing, dip coating, spray coating, and many others. There are a number of different configurations for syringes.

An example of a syringe and nozzles is depicted in FIG. 3. Syringe 210 is divided into two contiguous compartments; the first compartment is designated 301*a*, the second compartment is designated 301*b*. The first compartment has a first nozzle 211*a*; the second compartment has a second nozzle 211*b*. The compartments contain dispersants or solvents including nanoparticles. An example of solvent pastes, or dispersant pastes, is illustrated in FIG. 3. In the first compartment 301*a*, the nanoparticles 302*a* dissolved in the first dispersant paste, are made of an electrically conductive material. In the second compartment 301*b*, the nanoparticles 302*b* are dissolved in a second dispersant paste and are electrically non-conductive.

The concept of nanoparticles as used herein includes spherical or other three-dimensional clusters composed of atoms or molecules, of inorganic or organic chemical compounds, of one-dimensional wires, of two-dimensional crystals and platelets, and of nanotubes. Furthermore, the surfaces of the nanoparticles may be functionalized against aggregation, or for improving the adhesion of the nanoparticles of the second material. Functionalization can be achieved by attaching ligand molecules to the core of the nanoparticles. Examples of hydrophobic ligand molecules include trioctylphosphine oxide (TOPO), triphenylphosphine (TPP), dodecanethiol (DDT), tetraoctylammonium bromide (TOAB), and oleic acid (OA). Examples of hydrophilic ligand molecules include mercaptoacetic acid (MAA), mercaptopropionic acid (MPA), mercaptoundecanoic acid (MUA), mercaptosuccinic acid (MSA), dihydrolipic acid (DHLA), bis-sulphonated triphenylphosphine (mPEG5-SH, mPEG45-SH), and short peptide of sequence CALNN.

The nanoparticles 302*a* may be selected from, but not limited to, a group including metals, metal-coated polymers, metallized plastics, and metallized ceramics. The metals may include gold, silver, copper, aluminum, tin, zinc, and bismuth.

The nanoparticles 302*b* may be selected from, but not limited to, a group including metal oxides, metal nitrides, metal carbides, ceramics, plastics, polymers, and conducting nanoparticles coated with oxides, polymers, ceramics, and other con-conducting compounds and molecules.

Referring to the process flow of FIG. 1, during step 103 of the process flow the syringe 210 of the deposition equipment is moved across the first surface 201*a* of substrate 201 in order to deposit additively a layer (designated 200 in FIG. 2) of the solvent pastes onto the surface 201*a* of substrate 201. The deposition is programmed so that the layer comprises sequential zones, which are alternatively composed of the first solvent paste with electrically conductive nanoparticles 302*a* and the second solvent paste with electrically non-conductive nanoparticles 302*b*. In this embodiment, the deposition is conducted so that layer 200 has uniform thickness 200*a*.

Screen printing, flexographic printing, gravure printing, dip coating, spray coating, and inkjet printing comprising piezoelectric, thermal, acoustic, and electrostatic inkjet printing are examples of processes that may be used to deposit the nanoparticles.

As depicted in FIG. 2, layer 200 may extend over the available surface area, or it may cover only portions of the surface area such as islands between about 0.1 µm to 100 µm dependent on the drop size of the solvent paste. Examples of a few islands are designated 202 and 203 in FIG. 2. In the separation 204 between the islands 202 and 203, there is no paste deposition with nanoparticles. When using metallic leadframes, layer 200 may cover the whole leadframe surface area of one or more leads, or selected parts such as the chip attach pad.

FIG. 2 illustrates an example of deposition of electrically conductive and electrically non-conductive nanoparticles, as deposited by a computer-controlled two-compartment syringe of the inkjet printer. In the exemplary layer 200, the island of length 202 includes several zones 212*a* formed by the paste containing electrically conductive nanoparticles 302*a*. Zones 212*a* alternate with several zones 212*b* formed by the paste containing electrically non-conductive nanoparticles 302*b*. Zones 121*b* are contiguous with zones 212*a*, alternate with zones 212*a*, and have the same height 200*a*. Further included in layer 200 is the island of length 203, which includes several zones 213*a* formed by the paste containing electrically conductive nanoparticles 302*a*, and, contiguous with zones 213*a*, the zones 213*b* formed by the paste containing electrically non-conductive nanoparticles 302*b*.

During step 104 of the process flow of FIG. 1, energy is provided to increase the temperature for sintering together the nanoparticles 302a and 302b. The needed energy may be provided by a plurality of sources: thermal energy, photonic energy, electromagnetic energy, and chemical energy. When melting nanoparticles of a volume are sintering together, they may form necking connections, where the surfaces of the molten particles exhibit a constricted range resembling a neck between the volumes. As indicated in FIG. 4, the sintering process forms a layer 400 on surface 201a, which is composed of an array with alternating sequence of contiguous zones 410 of necked-together electrically conductive nanoparticles and zones 420 of necked-together electrically non-conductive nanoparticles. Zones 410 contain sintered nanoparticles 302a that are electrically conductive and zones 420 contain sintered nanoparticles 302b that are electrically non-conductive. The layer 400 has a substantially uniform height 400a. After the sintering process, the substrate surface has a dual-material nanoparticle adhesion layer with a patterned electrical conductance Concurrent with the sintering process is a diffusion process. During this diffusion process, nanoparticles 302a and 302b diffuse into the surface 201a. This diffusion process is based on atomic interdiffusion that creates an interdiffusion bond. Due to the diffusion into the substrate, the sintered nanoparticles 302a and 302b are anchored to the surface of the substrate.

During step 105 of the process flow shown in FIG. 1, the patterned conductivity dual-material nanoparticle adhesion layer 400, together with at least portions of the substrate 201 of first material are encapsulated into a package of polymeric compound. The process is illustrated in FIG. 5, wherein the polymeric compound is denoted 501. An example method for encapsulation by a polymeric compound is the transfer molding technology using a thermoset epoxy-based molding compound. Since the compound has low viscosity at the elevated temperature during the molding process, the polymeric compound can readily fill any voids 502a in the layer 400 of third material. The filling of the voids by polymeric material takes place for any voids, whether they are arrayed in an orderly pattern or in a random distribution, and whether they are shallow or in a random three-dimensional configuration including voids resembling spherical caverns with narrow entrances.

After the compound has polymerized and has cooled to ambient temperature, the polymeric compound 501 in the package as well as in the voids has hardened. After hardening of the plastic material, the polymeric-filled voids provide a bond between the package and the nanoparticle layer 400. In addition, as mentioned above, layer 400 is bonded to substrate 201 by metal interdiffusion 402a. As an overall result, the dual-material nanoparticle layer improves the adhesion between the plastic package 501 and the metallic substrate 201.

Figure 6:
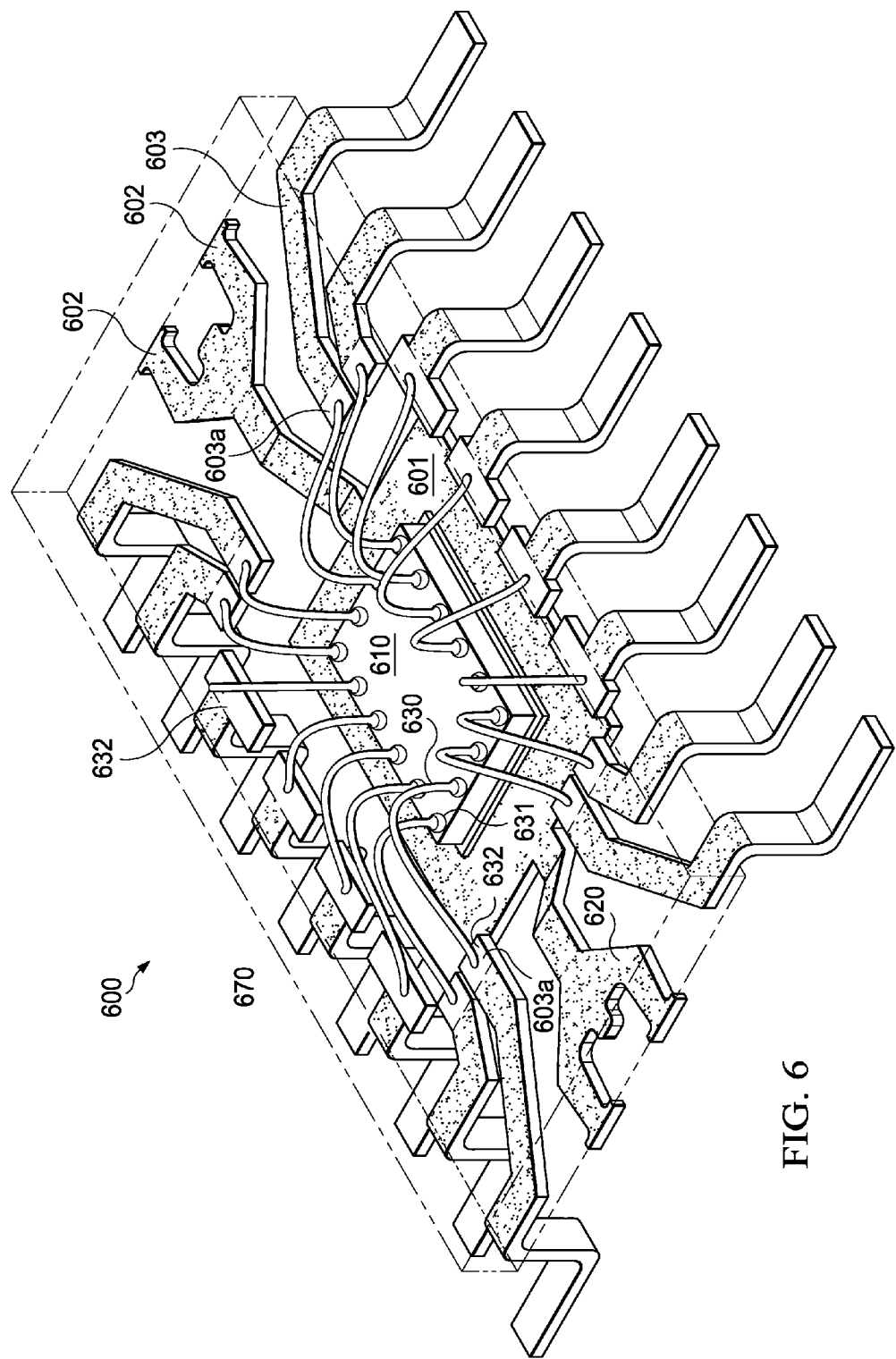
FIG. 6 illustrates a packaged semiconductor device with leadframe, wherein portions of the leadframe are covered by a dual-material nanoparticle adhesion layer having patterned electrical conductance and non-conductance according to an embodiment of the invention.

FIG. 6 illustrates an embodiment of adhesion by a nanoparticle adhesion layer patterned into zones of electrical conductance and insulation. The device includes a metallic leadframe and a plastic package. The embodiment includes a semiconductor device 600 with a leadframe including a pad 601 for assembling a semiconductor chip 610, tie bars 602 connecting pad 601 to the sidewall of the package, and a plurality of leads 603. The chip terminals are connected to the leads 603 by bonding wires 630, which commonly include ball bond 631 and stitch bond 632. In the example of FIG. 6, leads 603 are shaped as cantilevered leads; in other embodiments, the leads may have the shape of flat leads as used in Quad Flat No-Lead (QFN) devices or in Small Outline No-Lead (SON) devices. Along their longitudinal extension, tie bars 602 of the exemplary device in FIG. 6 include bendings and steps, since pad 601 and leads 603 are not in the same plane. In other devices, tie bars 602 are flat and planar, because pad 601 and leads 603 are in the same plane.

In FIG. 6, the portions of the leadframe which are included in the zones of electrical non-conductance of the nanoparticle adhesive layer (realized for instance by copper oxide) are marked by dashing 620. On the other hand, the leadframe portions 603a included in the zones of electrical conductance are free of dashing. Since the exemplary device 600 includes a package 670 for encapsulating chip 610 and wire bonds 630, any voids of the patterned layer are filled by the polymeric compound. Package 670 may be made of a polymeric compound such as an epoxy-based thermoset polymer, formed in a molding process, and hardened by a polymerization process. The adhesion between the polymeric compound of package 670 and the leadframe is improved by the patterned nanoparticle layer. Other devices may have more and larger areas of the leadframe covered by the dual-material nanoparticle adhesion layer.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A method for substrate modification comprising:
providing a substrate of a first material, the substrate having a first surface;
providing a first nozzle and a second nozzle, the first nozzle dispensing a first solvent paste including electrically conductive nanoparticles of a second material, and the second nozzle dispensing a second solvent paste including electrically non-conductive nanoparticles of a third material;
moving the nozzles across the first surface for additively depositing a layer comprising sequential and contiguous zones alternatingly composed of the first solvent paste and the second solvent paste, the layer having uniform thickness;
applying energy to increase the temperature for sintering together the nanoparticles of the second material and the nanoparticles of the third material, and for concurrently diffusing second material and third material into the substrate adjoining the first surface;
wherein the sintered nanoparticles form a layer composed of an alternating sequence of electrically conductive zones contiguous with electrically non-conductive zones.

2. The method of claim 1 wherein the substrate of the first material is selected from a group including laminated substrate and metallic leadframe.

3. The method of claim 1 wherein the second material is selected from a group including metal nanoparticles, metal-coated polymeric nanoparticles, metal-coated ceramic nanoparticles, and metal-coated plastic nanoparticles.

4. The device of claim 1 wherein the third material is selected from a group including metal oxides nanoparticles, polymeric compound nanoparticles, nitrogen compound nanoparticles, and electrically conducting nanoparticles coated with polymerics, oxides, and carbon compounds.

5. The method of claim 1 wherein the process of additively depositing is selected from a group including screen printing, flexographic printing, gravure printing, dip coating, spray coating, and inkjet printing comprising piezoelectric, thermal, acoustic, and electrostatic inkjet printing.

6. The method of claim 1 wherein the energy for sintering the second nanoparticles is selected from a group including thermal energy, photonic energy, electromagnetic energy, and chemical energy.

7. A method for enhancing adhesion of packaged semiconductor devices, comprising:
provinding a substrate of a first material, the substrate having a first surface;
providing a first nozzle and a second nozzle, the first nozzle dispensing a first solvent paste including electrically conductive nanoparticles of a second material, and the second nozzle dispensing a second solvent paste including electrically non-conductive nanoparticles of a third material;
moving the nozzles across the first surface for additively depositing a layer comprising sequential and contiguous zones alternatingly composed of the first solvent paste and the second solvent paste, the layer having uniform thickness;
applying energy to increase the temperature for sintering together the nanoparticles of the second material and the nanoparticles of the third material, and for concurrently diffusing second material and third material into the substrate region adjoining the first surface;
wherein the sintered nanoparticles form a layer composed of an alternating sequence of electrically conductive zones contiguous with electrically non-conductive zones; and
encapsulating the sintered nanoparticle layer and at least portions of the substrate into a package of a fourth material, the fourth material adhering to at least portions of the sintered nanoparticle layer.

8. The method of claim 7 wherein the substrate of the first material is selected from a group including laminated substrate and metallic leadframe.

9. The method of claim 8 wherein the substrate is a metallic leadframe for use in semiconductor devices with the first material selected from a group including copper, copper alloys, aluminum, aluminum alloys, iron-nickel alloys, and Kovar™.

10. The method of claim 9 wherein the first material includes a plated layer of a metal selected from a group including tin, silver, nickel, palladium, and gold.

11. The method of claim 7 wherein the package of the fourth material includes a polymeric compound such as an epoxy-based molding compound.

12. The method of claim 7 wherein the second material is selected from a group including metal nanoparticles, metal-coated polymeric nanoparticles, metal-coated ceramic nanoparticles, and metal-coated plastic nanoparticles.

13. The method of claim 7 wherein the third material is selected from a group including metal oxides nanoparticles, polymeric compound nanoparticles, nitrogen compound nanoparticles, and electrically conducting nanoparticles coated with polymerics, oxides, and carbon compounds.

14. The method of claim 7 further including, before the process of encapsulating, the process of assembling a semiconductor circuit chip on the substrate so that the chip will be positioned inside the package after the process of encapsulating.

* * * * *